(12) United States Patent
Lin et al.

(10) Patent No.: US 9,318,190 B1
(45) Date of Patent: Apr. 19, 2016

(54) MEMORY DEVICE

(71) Applicant: TAIWAN SEMICONDUCTOR MANUFACTURING CO., LTD., Hsinchu (TW)

(72) Inventors: Tzu-Kuei Lin, Chu-Pai (TW); Hung-Jen Liao, Hsin-Chu (TW); Yen-Huei Chen, Jhudong Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/501,623

(22) Filed: Sep. 30, 2014

(51) Int. Cl.
 *G11C 11/00* (2006.01)
 *G11C 11/419* (2006.01)

(52) U.S. Cl.
 CPC .................... *G11C 11/419* (2013.01)

(58) Field of Classification Search
 USPC ........................ 365/158, 189.09, 189.15, 163
 See application file for complete search history.

(56) References Cited

U.S. PATENT DOCUMENTS

| | | | |
|---|---|---|---|
| 2013/0265820 A1* | 10/2013 | Chih ................... | G11C 11/1673 365/158 |
| 2014/0119105 A1* | 5/2014 | Jan ........................ | G11C 11/16 365/158 |

* cited by examiner

*Primary Examiner* — Vu Le
(74) *Attorney, Agent, or Firm* — Maschoff Brennan

(57) ABSTRACT

An electronic device is disclosed that includes n memory cells, a replica memory array, and a sensing unit. Each of the n memory cells stores bit data, in which n is a positive integer. The replica memory array includes a first reference memory cell having a high logic state, a second reference memory cell having a low logic state, n−1 first pseudo reference memory cells having the low logic state, and n−1 second pseudo reference memory cells having the high logic state. The first reference memory cell and the n−1 first pseudo reference memory cells generate a first signal, and the second reference memory cell and the n−1 second pseudo reference memory cells generate a second signal. The sensing unit determines a logic state of the bit data of one of the n memory cells according to the first signal and the second signal.

22 Claims, 5 Drawing Sheets

MEMORY DEVICE

BACKGROUND

Memory devices are widely used in many applications. Memory devices include, a static random access memory (SRAM), a dynamic random access memory (DRAM), and so on.

In general, DRAM can provide a higher degree of integration. However, DRAM requires constant refreshing. As a result, the use of DRAM is limited for computer main memories by its power consumption and slow refresh speed.

On the other hand, SRAM can maintain its logic state as long as an adequate power is supplied. SRAM can operate with a higher speed and lower power consumption. Thus, SRAM can be utilized for computer cache memories, embedded memories or networking equipment memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
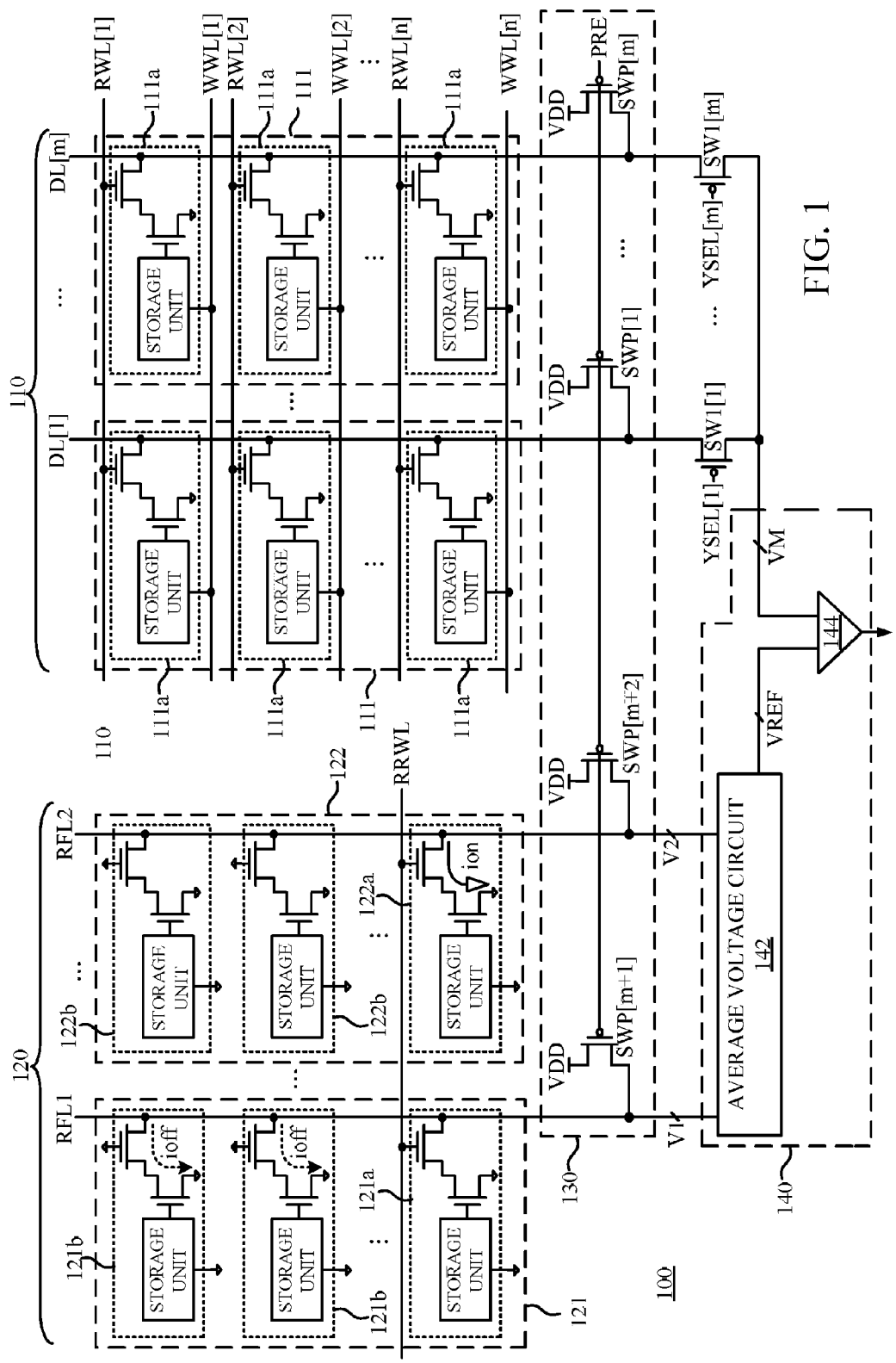
FIG. 1 is a schematic diagram of an electronic device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1 is a schematic diagram of an electronic device 100 in accordance with various embodiments of the present disclosure.

As illustratively shown in FIG. 1, the electronic device 100 includes a memory array 110, a replica memory array 120, a precharge circuit 130, multiplex switches SW1[1]-SW1[$m$], and a sensing unit 140. The memory array 110 includes memory columns 111, read word lines RWL[1]-RWL[n], write word lines WWL[1]-WWL[n], and data lines DL[1]-DL[$m$], in which n and m are positive integers.

For illustration, the memory columns 111 are disposed in parallel with each other, in which each memory column 111 includes n memory cells 111a. Each memory cell 111a is coupled to a corresponding one of the read word lines RWL[1]-RWL[n] and a corresponding one of the write word lines WWL[1]-WWL[n], and a corresponding one of the data lines DL[1]-DL[m]. During a write operation, one of the write word lines WWL[1]-WWL[n] is activated, and thus bit data are written into a storage unit of a corresponding memory cell 111a.

The replica memory array 120 is disposed at a side of the memory array 110. The replica memory array 120 includes a reference memory column 121, a reference read word line RRWL, and a reference memory column 122. The reference memory column 121 includes a reference memory cell 121a having a high logic state, n−1 pseudo reference memory cells 121b having a low logic state, and a reference line RFL1. In various embodiments, a memory cell stores the bit data of logic "1" when the memory cell is described to have the high logic state. Similarly, in various embodiments, a memory cell stores the bit data of logic "0" when the memory cell is described to have the low logic state. In other words, the reference memory cell 121a is configured to initially store the bit data of logic "1", and the n−1 pseudo reference memory cells 121b are configured to initially store the bit data of logic "0". The reference memory cell 121a and the n−1 pseudo reference memory cells 121b are coupled to the reference line RFL1, and are configured to generate a signal V1 transmitted through the reference line RFL1.

Similarly, the reference memory column 122 includes a reference memory cell 122a having the low logic state, n−1 pseudo reference memory cells 122b having the high logic state, and a reference line RFL2. The reference memory cell 122a and the n−1 pseudo reference memory cells 122b are coupled to the reference line RFL2, and are configured to generate a signal V2 transmitted through the reference line RFL2.

In some embodiments, the memory cells 111a, the reference memory cell 121a, the pseudo reference memory cells 121b, the reference memory cell 122a, and the pseudo reference memory cells 122b are configured to have the same circuit architecture with same feature sizes. Thus, process/voltage/temperature variations on the memory array 110 are similar to those on the replica memory array 120, and accordingly, the replica memory array 120 is able to be utilized to detect process/voltage/temperature variations on the memory array 110.

The precharge circuit 130 includes switches SWP[1]-SWP[m+2]. The switches SWP[1]-SWP[m] are coupled to the data lines DL[1]-DL[m], respectively. The switch SWP[m+1] is coupled to the reference line RFL1, and the switch SWP[m+2] is coupled to the reference line RFL2. The switches SWP[1]-SWP[m+2] are configured to be selectively turned on according to a precharge signal PRE. Thus, the reference line RFL1, the reference line RFL2, and the data lines DL[1]-DL[m] is able to be charged by a system voltage VDD when the switches SWP[1]-SWP[m+2] are turned on. In general, the reference line RFL1, the reference line RFL2, and the data lines DL[1]-DL[m] are charged before read/write operations are performed.

The multiplex switches SW1[1]-SW1[$m$] are coupled between the data lines DL[1]-DL[m] and the sensing unit 140, respectively. The multiplex switches SW1[1]-SW1[$m$] are configured to be selectively turned on according to selection signals YSEL[1]-YSEL[m], respectively, so as to transmit the bit data of the corresponding memory cell 111a to the sensing unit 140. The sensing unit 140 is configured to determine the logic state of the bit data transmitted from the memory array 110, according to the signal V1 and the signal V2. With such configuration, the margin window for reading the bit data is improved. The detailed functions and operations of the electronic device 100 will be explained in following paragraphs.

The numbers of the memory cells 111a, the pseudo reference memory cells 121b, and the pseudo reference memory cells 122b in FIG. 1 are given for illustrative purposes. Various numbers of the memory cells 111a, the pseudo reference memory cells 121b, and the pseudo reference memory cells 122b are within the contemplated scope of the present disclosure.

Figure 2:
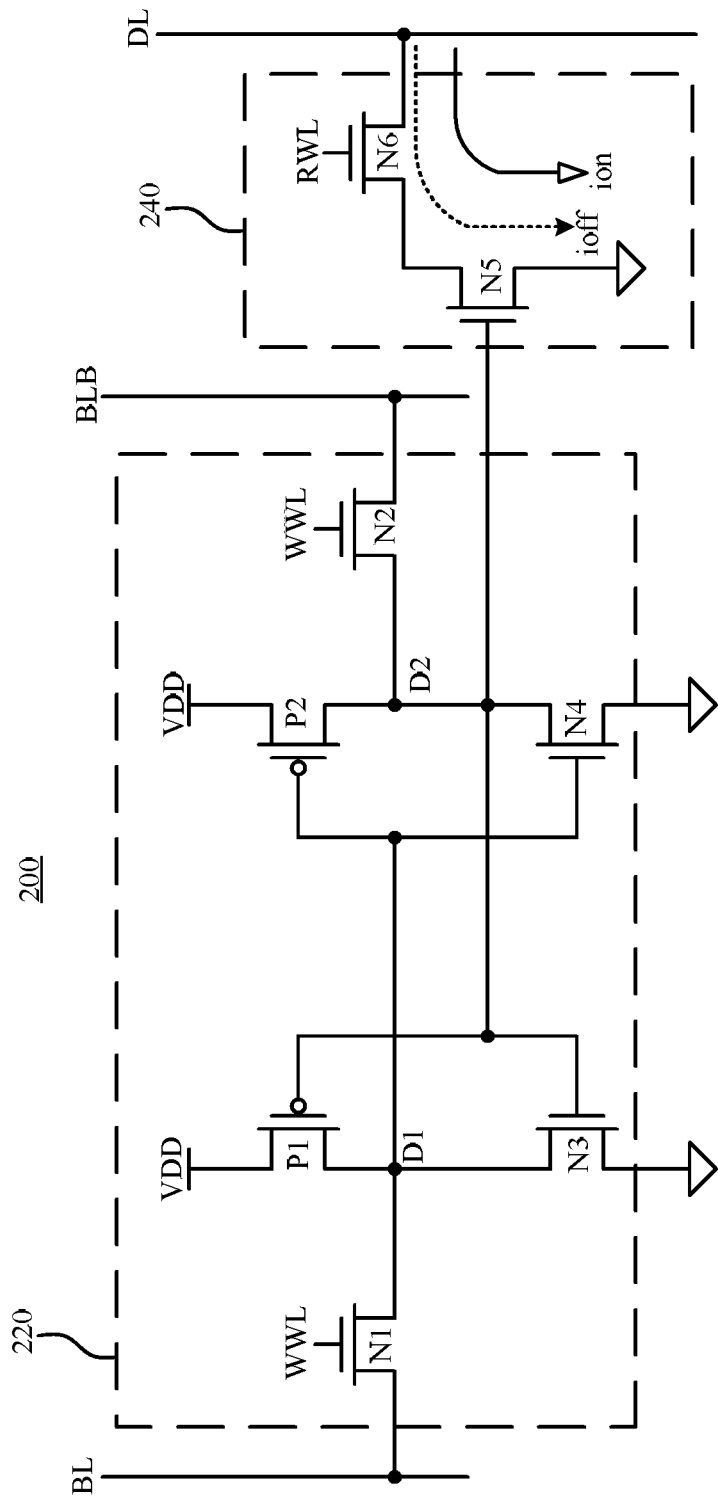
FIG. 2 is a schematic diagram of a memory cell shown in FIG. 1 in accordance with various embodiments of the present disclosure.

FIG. 2 is a schematic diagram of a memory cell shown in FIG. 1 in accordance with various embodiments of the present disclosure.

As illustratively shown in FIG. 2, the memory cell 200 includes a storage unit 220 and a read unit 240. The storage unit 220 is configured to store the bit data. The storage unit 220 includes a bit cell that includes switches N1-N4 and switches P1-P2. In some embodiments, the switches N1-N4 and P1-P2 are transistors, such that the bit cell in the storage unit 220 is a six transistors (6T) bit cell. The switch N1 and the switch N2 are coupled to the write word line WWL, and are turned on when the write word line WWL is activated. When the switch N1 and the switch N2 are turned on, the bit data stored in the storage unit 220 is changed based on the data on a bit line BL and a bit line BLB, and the logic state of the memory cell 200 is accordingly changed.

For illustration, when the storage unit 220 stores the bit data of logic "0" (the memory cell 200 is at the low logic state), an internal node D1 of the storage unit 220 is at a low voltage level, and an internal node D2 of the storage unit 220 is at a high voltage level. Alternatively, when the storage unit 220 stores the bit data of logic "1" (the memory cell 200 is at the high logic state), the internal node D1 is at the high voltage level, and an internal node D2 is at the low voltage level.

The read unit 240 includes switches N5-N6, in which the switch N5 is selectively turned on according to the voltage level of the internal node D2. The switch N6 is coupled between the switch N5 and the data line DL, and is selectively turned on according to the voltage level of the read word line RWL.

As mentioned above, the data line DL is charged by the voltage VDD before the read/write operation is performed. When the memory cell 200 having the high logic state is read, the internal node D2 is at the low voltage level. Thus, the switch N6 is turned on, and the switch N5 is turned off. As a result, the voltage level of the data line DL is kept at the voltage VDD, and the sensing unit 140 receives the bit data with high voltage level and determines that the logic state of the storage unit 220 is at the high logic state. When the selected memory cell 200 having the high logic state is read, the data line DL is discharged with the leakage current of other unselected memory cells, e.g., current ioff leaking from the data line DL through the turn-on switch N6 and the turn-off switch N5, and the voltage level of the data line DL is reduced.

Alternatively, when the memory cell 200 having the low logic state is read, the internal node D2 is at the high voltage level. Thus, the switch N6 is turned on, and the switch N5 is turned on. As a result, the data line DL is discharged by a current ion flowing through the turn-on switch N6 and the turn-on switch N5 to ground, and the sensing unit 140 receives the bit data with low voltage level and determines that the logic state of the storage unit 220 is at the low logic state.

Reference is made to both of FIG. 1 and FIG. 2. As shown in FIG. 2, when the selected memory cell 200 having the high logic state is read, the data line DL is discharged with the leak current of other unselected memory cells 200, e.g., current ioff leaking from the data line DL through the turn-on switch N6 and the turn-off switch N5, and the voltage level of the data line DL is reduced. Under certain process/voltage/temperature conditions, the leakage current ioff is increased, resulting in an incorrect read operation.

As shown FIG. 1, the reference memory column 121 is configured to simulate an extreme case for reading the bit data of logic "1" in the memory column 111 in various embodiments. The extreme case for reading the bit data of logic "1" in the memory column 111 is that the selected memory cell 111a stores the bit data of logic "1", and all other unselected memory cells 111a store the bit data of logic "0". In other words, when the selected memory cell 111a is read, the data line DL is discharged by the leakage current ioff from n−1 the unselected memory cells 111a. Thus, as described above, the reference memory cell 121a is configured to have the high logic state in initial, and the n−1 pseudo reference memory cells 121b are configured to have the low logic state in initial.

Similarly, the reference memory column 122 is configured to simulate an extreme case for reading the bit data of logic "0" in the memory column 111. The extreme case for reading the bit data of logic "0" in the memory column 111 is that the data line DL is only discharged by one current ion of the selected memory cell 111a having the low logic state. Thus, the reference memory cell 122a is configured to have the low logic state in initial, and the n−1 pseudo reference memory cells 122b are configured to have the high logic state in initial.

In some embodiments, the internal nodes d2 of the n−1 pseudo reference memory cells 121b and the reference memory cell 122a are configured to receive the system voltage VDD, so as to store the bit data of logic "0" in initial. Similarly, the internal nodes d2 of the n−1 pseudo reference memory cells 122b and the reference memory cell 121a are coupled to ground, so as to store the bit data of logic "1" in initial.

In some embodiments, as the n−1 pseudo reference memory cells 121b and the n−1 pseudo reference memory cells 122b are configured to generate the leakage current to simulate the different cases for reading the bit data of logic "1" or logic "0", the n−1 pseudo reference memory cells 121b and the n−1 pseudo reference memory cells 122b are not to be written another bit data. Thus, the write word lines WWL for the n−1 pseudo reference memory cells 121b and the n−1 pseudo reference memory cells 122b are coupled to ground.

Similarly, in some embodiments, based on the same reason, the bit data of the n−1 pseudo reference memory cells 121b and the n−1 pseudo reference memory cells 122b are not to be read during the read operation. Thus, the read word lines RWL for the n−1 pseudo reference memory cells 121b and the n−1 pseudo reference memory cells 122b are also coupled to ground.

The arrangement of the memory cell 200 in FIG. 2 is given for illustrative purposes. Various types of the memory cell 200 are able to be applied to the memory cells 111a, the reference memory cell 121a, the reference memory cell 122a, the n−1 pseudo reference memory cells 121b and the n−1 pseudo reference memory cells 122b, and those types are considered to be within the contemplated scope of the present disclosure.

Figure 3:
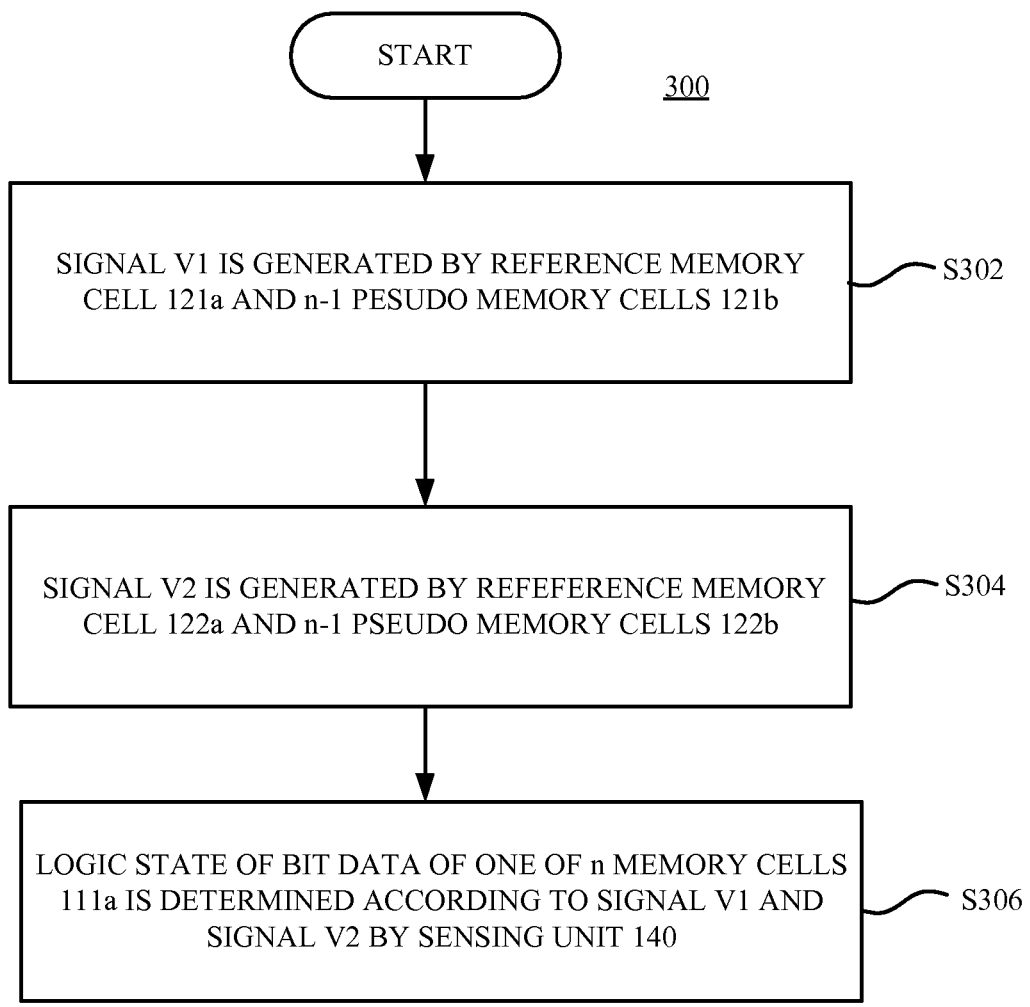
FIG. 3 is a flow chart of a method illustrating operations of the electronic device in FIG. 1, in accordance with various embodiments of the present disclosure.

FIG. 3 is a flow chart of a method 300 illustrating operations of the electronic device 100 in FIG. 1, in accordance with various embodiments of the present disclosure. For illustration, the operations of the replica memory array 120 in FIG. 1 are described by the method 300 with reference to FIG. 3.

In operation S302, a signal V1 is generated by the reference memory cell 121a and the n−1 pseudo memory cells 121b.

In operation S304, a signal V2 is generated by the reference memory cell 122a and the n−1 pseudo memory cells 122b.

For illustration, the reference read word line RRWL is activated whenever a read operation is performed, the signal V1 is indicative of the voltage transmitted through the reference line RFL1, and the signal V2 is indicative of the voltage transmitted through the reference line RFL2. With such configuration, the signal V1 is indicative of the voltage on the reference line RFL1 being discharged by the leakage currents ioff. Also, the signal V2 is indicative of the voltage on the reference line RFL2 being discharged by the current ion.

In operation S306, the logic state of the bit data of one of the n memory cells 111a is determined according to the signal V1 and the signal V2 by the sensing unit 140.

For illustration, when the read word line RWL[1] and the multiplex switch SW1[1] is activated, the memory cell 111a at position[1,1] of the memory array 110 is selected. The bit data (i.e., voltage VM in FIG. 1) of the memory cell 111a at position [1,1] is transferred to the sensing unit 140 through the data line DL[1]. In some embodiments, as shown in FIG. 1, the sensing unit 140 includes an average voltage circuit 142 and a sense amplifier 144. The average voltage circuit 142 is configured to generate a reference voltage VREF according to the signal V1 and the signal V2. The reference voltage VREF is configured to be a half of the sum of the signal V1 and the signal V2. The sense amplifier 144 is configured to determine the logic state of the bit data (i.e., VM) according to the reference voltage VREF.

Figure 4:
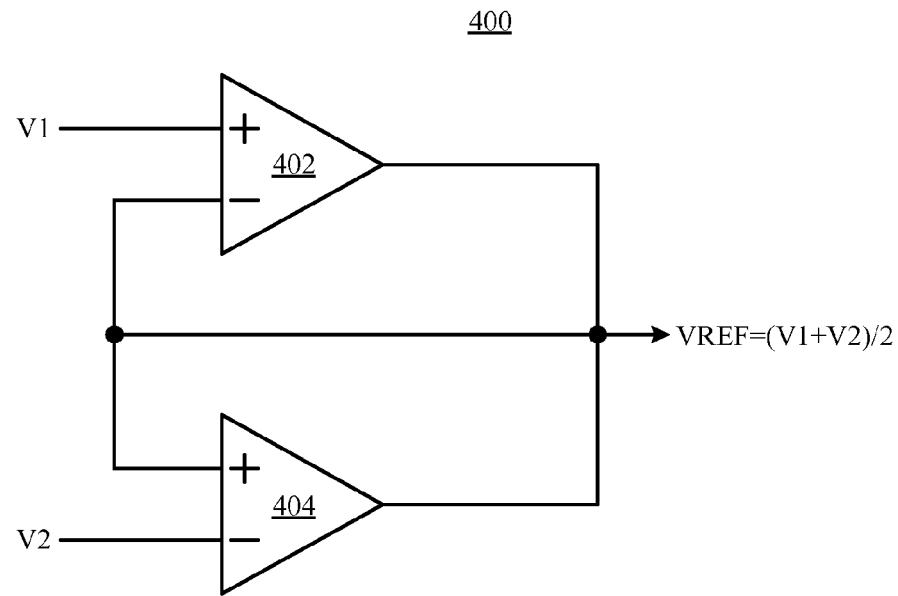
FIG. 4 is a schematic diagram of an average voltage circuit shown in FIG. 1 in accordance with various embodiments of the present disclosure.

FIG. 4 is a schematic diagram of an average voltage circuit shown in FIG. 1 in accordance with various embodiments of the present disclosure.

As illustratively shown in FIG. 4, the average voltage circuit 400 includes an amplifier 402 and an amplifier 404, in which the amplifier 402 and the amplifier 404 are configured as two voltage followers.

For illustration, a non-inverting input terminal of the amplifier 402 is configured to receive the signal V1, an inverting input terminal of the amplifier 402 is coupled to an output terminal the amplifier 402, and is configured to generate the reference voltage VREF. An inverting input terminal of the amplifier 404 is configured to receive the signal V2, a non-inverting input terminal of the amplifier 404 is coupled to an output terminal the amplifier 404 and the inverting input terminal of the amplifier 402. The arrangement of the average voltage circuit 400 in FIG. 4 is given for illustrative purposes. Various types of the average voltage circuit are within the contemplated scope of the present disclosure.

Figure 5:
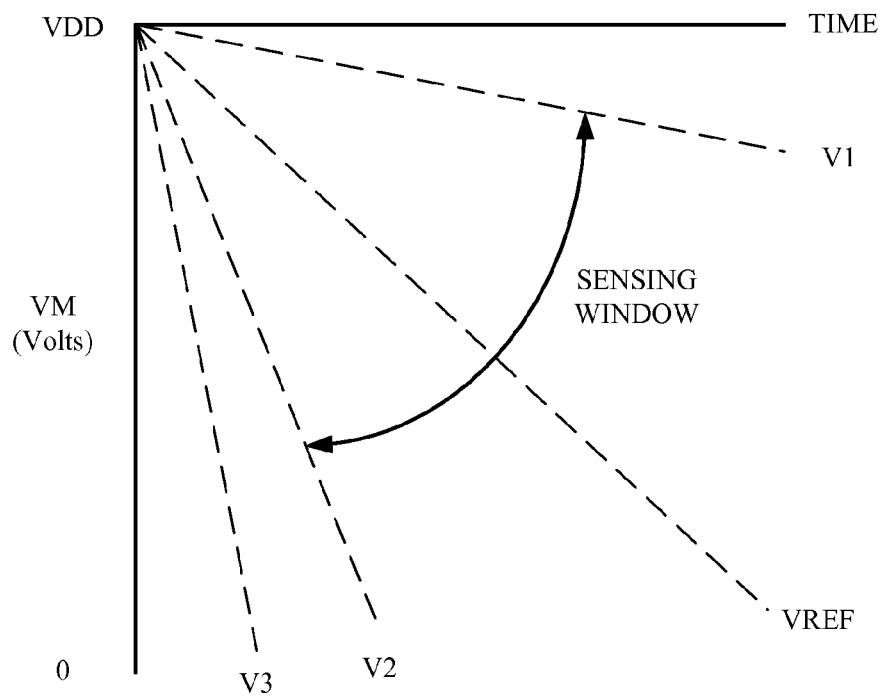
FIG. 5 is a graph illustrating the operation relation between the reference voltage VREF and the voltage VM indicative of the bit data in FIG. 1 in accordance with various embodiments of the present disclosure.

FIG. 5 is a graph illustrating the operation relation between the reference voltage VREF and the voltage VM indicative of the bit data in FIG. 1 in accordance with various embodiments of the present disclosure.

As illustratively shown in FIG. 5, when both of the selected memory cell 111a and the all unselected memory cells 111a store the bit data of logic "1", the voltage VM is configured as the voltage VDD. When the selected memory cell 111a stores the bit data of logic "1", and the all unselected memory cells 111a stores the bit data of logic "0", the voltage VM is estimated to be the voltage indicative of the signal V1.

Explained in a different way, when all of the memory cells 111a in the same memory column 111 stores the bit data of logic "1", the voltage VM is able to be kept at the voltage VDD without the leakage currents ioff. Further, when the selected memory cell 111a stores the bit data of the logic"1", the voltage VM is reduced to be the voltage of the signal V1 at the extreme case for reading the bit data of logic "1". In other words, under any variations, the voltage VM indicative of the bit data ranges from V1 to VDD.

Similarly, when the selected memory cell 111a stores the bit data of logic "0" and the all unselected memory cells 111a store the bit data of logic "1" (i.e., the extreme case for reading the bit data of logic "0"), the voltage VM indicative of the bit data is estimated to be the voltage of the signal V2. When all of the memory cells 111a in the memory column 111 stores the bit data of logic "0", the voltage VM is at a voltage V3. In other words, the voltage VM indicative of the bit data ranges from the voltage V2 to the voltage V3 under any conditions for reading the bit data of logic "0".

As shown in FIG. 4, the sense amplifier 420 determines the logic state of the bit data according to the reference voltage VREF and the voltage VM. When the voltage VM is greater than the reference voltage VREF, the logic state of the bit data is determined as logic "1". Alternatively, when the voltage VM is less than the reference voltage VREF, the logic state of the bit data is determined as logic "0". As a result, the sensing window is improved as: (V1+V2)/2 to (V1−V2)/2, which is symmetrical for reading both of the bit data of logic "1" and logic "0".

As mentioned above, under some process/voltage/temperature conditions, the leakage current ioff, illustrated in FIG. 1, is increased. As a result, the sensing unit 140 reads a wrong bit data from the memory array 110. In some approaches, a data keeper is further utilized for keeping the voltage level of the data line DL. However, for reading the bit data of logic "0", the data line DL is suffered from the data keeper when the data keeper is utilized. In other words, the voltage level of the data line DL is slowly decreased by the current ion with the data keeper, resulting in a slow operation speed. As a result, under certain process/voltage/temperature conditions, an incorrect read operation for reading the bit data of logic "0".

With the configurations illustrated in FIG. 1 together with the operations illustrated in FIG. 5, the sensing unit 140 determines the logic state of the bit data according to the reference voltage VREF that is generated from the signal V1 and the signal V2. As the signal V1 is indicative of the voltage of the bit data at the extreme case for reading the bit data of logic "1", and the signal V2 is indicative of the voltage of the bit data at the extreme case for reading the bit data of logic "0", the reference voltage VREF is able to be dynamically adjusted with the similar variations on the memory array 110. As a result, the bit data are correctly read without the data keeper, and thus the operation speed of the electronic device 100 is improved.

Figure 6:
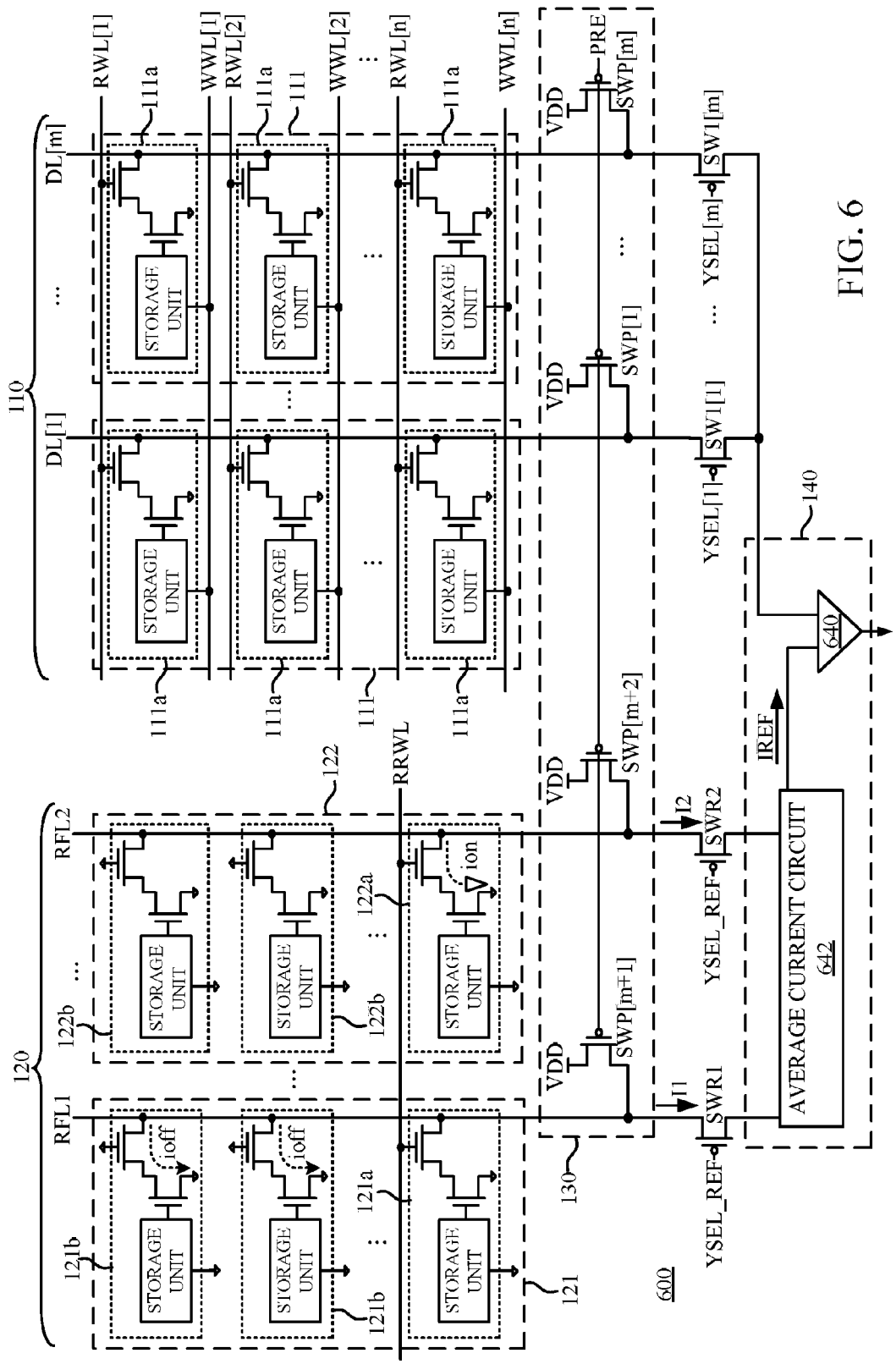
FIG. 6 is a schematic diagram of an electronic device in accordance with various embodiments of the present disclosure.

FIG. 6 is a schematic diagram of an electronic device 600 in accordance with various embodiments of the present disclosure. Compared with the electronic device 100 in FIG. 1, the electronic device 600 further includes a reference switch SWR1 and a reference switch SWR2, and the sensing unit 140 of the electronic device 600 includes a current sense amplifier 640 and an average current circuit 642.

As shown in FIG. 6, the reference switch SWR1 is coupled between the reference line RFL1 and an input terminal of the current sense amplifier 640. The reference switch SWR2 is coupled between the reference line RFL2 and the average current circuit 642. The reference switch SWR1 is configured to selectively transmit a current I1 to the average current circuit 642 according to a reference selection signal YSEL_REF. The reference switch SWR2 is configured to selectively transmit a current I2 to the average current circuit 642 according to the reference selection signal YSEL_REF. The average current circuit 642 is configured to generate a reference current IREF according to the current I1 and the current I2, in which the reference current IREF is a half of a sum of the current I1 and the current I2. The current sense amplifier 640 is configured to determine the logic state of the bit data according the reference current IREF. In some embodiments, the average current circuit 642 includes a current mirror circuit. The operations of the electronic device 600 are similar with the operations of the electronic device 100, and the repetitious descriptions are not given here.

In some further embodiments, the operations of the electronic device 600 can be performed without the average current circuit 642. For illustration, the reference switch SWR1 is coupled between the reference line RFL1 and the input terminal of the current sense amplifier 640. The reference switch SWR2 is coupled between the reference line RFL2 and the input terminal of the current sense amplifier 640. In this arrangement, the current I1 transmitted through the reference line RFL1 and the current I2 transmitted through the reference line RFL2 are configured to be half of a current transmitting through one of the multiplex switches SW1[1]-SW1[m]. In some embodiments, the width of the reference switch SWR1 and the reference switch SWR2 is configured to be half of the width of the multiplex switches SW1[1]-SW1[m]. Thus, the similar operations are able to be achieved, and the repetitious descriptions are not given here.

In some embodiments, an electronic device is disclosed that includes n memory cells, a replica memory array, and a sensing unit. Each of the n memory cells is configured to store bit data, in which n is a positive integer. The replica memory array includes a first reference memory cell having a high logic state, a second reference memory cell having a low logic state n−1 first pseudo reference memory cells having the low logic state, and n−1 second pseudo reference memory cells having the high logic state. The first reference memory cell and the n−1 first pseudo reference memory cells are configured to generate a first signal, and the second reference memory cell and the n−1 second pseudo reference memory cells are configured to generate a second signal. The sensing unit is configured to determine a logic state of the bit data of one of the n memory cells according to the first signal and the second signal.

Also disclosed is an electronic device that includes a memory column, a replica memory array disposed at the side of the memory column, and a sense amplifier. The memory column includes n memory cells coupled to a data line, and n is a positive integer. The replica memory array includes a first reference memory cell having a high logic state, a second reference memory cell having a low logic state, n−1 first pseudo reference memory cells having the low logic state, n−1 second pseudo reference memory cells having the high logic state, a first reference line, and a second reference line. The first reference line is coupled to the first reference memory cell and the n−1 first pseudo reference memory cells. The second reference line is coupled to the second reference memory cell and the n−1 second pseudo reference memory cells. The sense amplifier is configured to read the bit data of the n memory cells. A first input terminal of the sense amplifier is coupled to the first reference line and the second reference line, and a second input terminal of the sense amplifier is coupled to the data lines.

Also disclosed is a method for that includes the operations below. A first signal is generated by a first reference memory cell having a high logic state and n−1 first pseudo reference memory cells having a low logic state. A second signal is generated by a second reference memory cell having the low logic state and n−1 second pseudo reference memory cells having the high logic state. A logic state of the bit data of one of n memory cells is determined according to the first signal and the second signal by a sense amplifier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   n memory cells, each of the n memory cells being configured to store bit data, wherein n is a positive integer;
   a replica memory array, comprising:
   a first reference memory cell having a high logic state;
   a second reference memory cell having a low logic state;
   n−1 first pseudo reference memory cells having the low logic state; and
   n−1 second pseudo reference memory cells having the high logic state, wherein the first reference memory cell and the n−1 first pseudo reference memory cells are configured to generate a first signal, and the second reference memory cell and the n−1 second pseudo reference memory cells are configured to generate a second signal; and
a sensing unit configured to determine a logic state of the bit data of one of the n memory cells according to the first signal and the second signal.

2. The electronic device of claim 1, wherein the replica memory array further comprises:
a first reference line coupled to the first reference memory cell and the n−1 first pseudo reference memory cells, wherein the first reference memory cell and the n−1 first pseudo reference memory cells are configured to generate the first signal to the first reference line; and
a second reference line coupled to the second reference memory cell and the n−1 second pseudo reference memory cells, wherein the second reference memory cell and the n−1 second pseudo reference memory cells are configured to generate the second signal to the second reference line.

3. The electronic device of claim 2, wherein the first reference memory cell and the second reference memory cell are coupled to a reference read word line, the first signal is a first voltage transmitted through the first reference line, and the second signal is a second voltage transmitted through the second reference line;
wherein when the reference read word line is activated, the first voltage is discharged with leakage currents of the n−1 first pseudo reference memory cells, and the second voltage is discharged with a current of the second reference memory cell.

4. The electronic device of claim 2, wherein the first signal is a first voltage transmitted through the first reference line, and the second signal is a second voltage transmitted through the second reference line, the sensing unit comprising:
an average voltage circuit configured to generate a reference voltage according to the first voltage and the second voltage, wherein the reference voltage is a half of the sum of the first voltage and the second voltage; and
a sense amplifier configured to determine the logic state of the bit data according to the reference voltage.

5. The electronic device of claim 4, wherein when the voltage of the bit data is greater than the reference voltage, the logic state of the bit data is the high logic state, and when the voltage of the bit data is less than the reference voltage, the logic state of the bit data is the low logic state.

6. The electronic device of claim 4, wherein the average voltage circuit comprises:
a first amplifier having a first input terminal, a second input terminal, and an output terminal, wherein the first input terminal of the first amplifier is configured to receive the first signal, the second input terminal of the first amplifier is coupled to the output terminal of the first amplifier, and is configured to generate the reference voltage; and
a second amplifier having a first input terminal, a second input terminal, and an output terminal, wherein the first input terminal of the second amplifier is configured to receive the second signal, the second input terminal of the second amplifier is coupled to the output terminal of the second amplifier and the second input terminal of the first amplifier.

7. The electronic device of claim 2, wherein the first signal is a first current transmitted through the first reference line, the second signal is a second current transmitted through the second reference line, the sensing unit comprises:
a current sense amplifier configured to determine the logic state of the bit data according to the first current and the second current.

8. The electronic device of claim 7, further comprising:
a multiplex switch configured to selectively transmit the bit data of one of the n memory cells to the current sense amplifier according to a selection signal;
a first reference switch configured to selectively transmit the first current to the current sense amplifier according to a reference selection signal;
a second reference switch configured to selectively transmit the second current to the current sense amplifier according to the reference selection signal, wherein the first current and the second current are configured to be half of a current passing through the multiplex switch.

9. The electronic device of claim 8, wherein a width of the first reference switch and a width of the second reference switch are a half of a width of the multiplex switch.

10. The electronic device of claim 7, wherein the sensing unit further comprises:
an average current circuit configured to generate a reference current according to the first current and the second current, wherein the reference current is a half of a sum of the first current and the second current, and the current sense amplifier is further configured to determine the logic state of the bit data according to the reference current.

11. The electronic device of claim 2, further comprising:
a data line configured to transmit the bit data to the sensing unit; and
a precharge circuit configured to charge the data line, the first reference line, and the second reference line according to a precharge signal.

12. An electronic device, comprising:
a memory column, comprising n memory cells coupled to a data line, and n being a positive integer;
a replica memory array disposed at the side of the memory column, the replica memory array comprising:
a first reference memory cell having a high logic state;
a second reference memory cell having a low logic state;
n−1 first pseudo reference memory cells having the low logic state;
n−1 second pseudo reference memory cells having the high logic state;
a first reference line coupled to the first reference memory cell and the n−1 first pseudo reference memory cells; and
a second reference line coupled to the second reference memory cell and the n−1 second pseudo reference memory cells; and
a sense amplifier configured to read bit data of the n memory cells, wherein a first input terminal of the sense amplifier is coupled to the first reference line and the second reference line, and a second input terminal of the sense amplifier is coupled to the data line.

13. The electronic device of claim 12, further comprising:
an average voltage circuit coupled to the first reference line and the second reference line, and configured to generate a reference voltage, the reference voltage being a half of a sum of the voltage transmitted through the first reference line and the voltage transmitted through the second reference line, wherein the first input terminal of the sense amplifier is coupled to the average voltage circuit to receive the reference voltage.

14. The electronic device of claim 13, wherein the average voltage circuit comprises:
a first amplifier having a first input terminal, a second input terminal, and an output terminal, wherein the first input terminal of the first amplifier is coupled to the first reference line, the second input terminal of the first amplifier is coupled to the output terminal of the first amplifier, and is configured to generate the reference voltage; and a second amplifier having a first input terminal, a second input terminal, and an output terminal, wherein the first input terminal of the second amplifier is configured to the second reference line, the second input terminal of the second amplifier is coupled to the output terminal of the second amplifier and the second input terminal of the first amplifier.

15. The electronic device of claim 12, further comprising:

a multiplex switch coupled between the data line and the second input terminal of the sense amplifier;

a first reference switch coupled between the first reference line and the first input terminal of the sense amplifier; and a second reference switch coupled between the second reference line and the first input terminal of the sense amplifier, wherein the sense amplifier is a current sense amplifier, and the current transmitted through the first reference line and the current transmitted through the second reference line are configured to be half of a current transmitted through the multiplex switch.

16. The electronic device of claim 15, wherein a width of the first reference switch and a width of the second reference switch are half of a width of the multiplex switch.

17. The electronic device of claim 12, further comprising:

an average current circuit coupled between the first reference line, the second reference line and the first input terminal of the sense amplifier, and configured to generate a reference current, the reference current being a half of a sum of the current transmitted through the first reference line and the current transmitted through the second reference line, wherein the first input terminal of the sense amplifier is coupled to the average current circuit to receive the reference current.

18. A method for controlling an electronic device, the electronic device comprising n memory cells, n being a positive integer, the method comprising:

generating a first signal by a first reference memory cell having a high logic state and n−1 first pseudo reference memory cells having a low logic state;

generating a second signal by a second reference memory cell having the low logic state and n−1 second pseudo reference memory cells having the high logic state; and determining a logic state of bit data of one of the n memory cells according to the first signal and the second signal by a sense amplifier.

19. The method of claim 18, wherein determining the logic state of the bit data of one of the n memory cells comprises:

generating a reference voltage by averaging the first signal and the second signal; and determining the logic state of the bit data of one of the n memory cells according to the reference voltage by the sense amplifier.

20. The method of claim 19, wherein when the voltage of the bit data is greater than the reference voltage, the logic state of the bit data is at the high logic state, and when the voltage of the bit data is less than the reference voltage, the logic state of the bit data is at the low logic state.

21. The method of claim 18, wherein the first reference memory cell and n−1 first pseudo reference memory cells are coupled to a first reference line, the second reference memory cell and n−1 second pseudo reference memory cells are coupled to a second reference line, the first signal is a first current transmitted through the second reference line, and the second signal is a second current transmitted through the second reference line, and determining the logic state of the bit data of one of the n memory cells comprises:

determining the logic state of the bit data according to the first current and the second current by the sense amplifier, wherein the sense amplifier is a current sense amplifier.

22. The method of claim 21, wherein determining the logic state of the bit data further comprises:

transmitting the bit data from the one of the n memory cells to the current sense amplifier through a multiplex switch;

transmitting the first current to the current sense amplifier through a first reference switch; and transmitting the second current to the current sense amplifier through a second reference switch, wherein a width of the first reference switch and a width of the second reference switch are half of a width of the multiplex switch.

* * * * *